United States Patent [19]

Marthe et al.

[11] 4,209,740
[45] Jun. 24, 1980

[54] DETECTOR FOR LOCATING THE INTERFACIAL BOUNDARY LEVEL BETWEEN TWO LIQUIDS

[75] Inventors: Louis Marthe, Pau; Lucien Mondeil, Morlaas; Max Serrus, Denguin-Lescar, all of France

[73] Assignee: Societe Nationale Elf Aquitaine (Production), Courbevoie, France

[21] Appl. No.: 894,119

[22] Filed: Apr. 6, 1978

[30] Foreign Application Priority Data

Apr. 6, 1977 [FR] France ............................... 77 10432

[51] Int. Cl.² ...................... G01R 27/26; G01F 23/26
[52] U.S. Cl. ............................... 324/61 R; 73/304 C; 324/61 P
[58] Field of Search ............... 324/61 R, 61 P, 61 QS, 324/61 QL; 73/304 C; 361/284; 340/620

[56] References Cited

U.S. PATENT DOCUMENTS

| 2,573,172 | 10/1951 | Ennis et al. | 324/61 QS |
|---|---|---|---|
| 2,772,393 | 11/1956 | Davis | 324/61 QS |
| 2,963,908 | 12/1960 | Shawhan | 324/61 R X |
| 3,012,193 | 12/1961 | Breen | 324/61 R |
| 3,133,437 | 5/1964 | Remke et al. | 324/61 R X |
| 3,181,557 | 5/1965 | Lannan, Jr. | 324/61 P |
| 3,189,268 | 6/1965 | Nilsson | 324/61 P |
| 3,297,941 | 1/1967 | Wolfendale | 324/61 R X |
| 3,777,257 | 12/1973 | Geisselmann | 324/61 R |
| 3,815,020 | 6/1974 | Mayer | 324/61 R |
| 4,048,844 | 9/1977 | Dunikowski et al. | 324/61 QS X |

FOREIGN PATENT DOCUMENTS

| 804855 | 11/1958 | United Kingdom | 324/61 P |
|---|---|---|---|
| 468149 | 5/1975 | U.S.S.R. | 324/61 R |

Primary Examiner—Rudolph V. Rolinec
Assistant Examiner—Ernest F. Karlsen

[57] ABSTRACT

The level of the interfacial boundary between two liquids having different dielectric constants is located by means of a detector in which two parallel sectional members constitute external capacitor plates supported by a metallic base plate and in which small metallic plates encased within an electrically insulated central upright member constitute central capacitor plates. The assembly thus forms a plurality of capacitors, the plates of which are immersed in at least one of the liquids. Each capacitor forms part of an oscillating circuit connected to electronic means for effecting a comparison between the oscillation frequency and a reference frequency.

10 Claims, 4 Drawing Figures

DETECTOR FOR LOCATING THE INTERFACIAL BOUNDARY LEVEL BETWEEN TWO LIQUIDS

This invention relates to a detector for locating the interfacial boundary level between two liquids. The chief potential application of the invention is the pollution of sea water by crude petroleum in the vicinity of underwater drilling or production installations.

Known methods for locating a boundary level between two liquids include those which consist in measuring the capacitance of a capacitor which is immersed in the liquid or liquids. It is assumed in these methods that the dielectric constants of said liquids are different. This being so, the capacitance of said capacitor depends on the respective quantities of liquid which are present between the capacitor plates and is therefore dependent in the final analysis on the position of the interfacial boundary level.

Relevant information on this subject can be obtained by referring to U.S. Pat. No. 2,426,252 granted on Aug. 26, 1947 in respect of "System of flat electrodes".

Measurement of capacitance can be performed by means of a frequency measurement which is taken by placing the capacitor in an oscillating circuit. Determination of the level of the interfacial boundary between two liquids then consists in measuring the oscillation frequency of the circuit.

The majority of devices for carrying out this method give the position of the boundary level with respect to the two capacitor plates. But consideration can also be given to simpler devices which are more in the nature of detectors than measuring instruments insofar as they deliver information of the binary type in which, for example, the interfacial boundary does or does not reach a predetermined level.

In order to obtain this type of information, it is only necessary to determine whether the oscillation frequency of the circuit does or does not attain a reference value corresponding to the value assumed by the oscillation frequency when the interfacial boundary between the liquids reaches said level. By way of example, the reference frequency adopted can be the value obtained when the boundary level between the liquids is located at mid-height between the capacitor plates. A detector based on this principle accordingly gives the position of the boundary level with respect to the mid-plane of the capacitor plates by means of an indication of the "above" or "below" type.

It is apparent that a scale having a number of reference levels can be obtained by employing a plurality of capacitors placed one above the other. This accordingly makes it possible to locate a boundary level with respect to any two reference levels by means of an indication which gives the order of the two reference levels located on each side of the boundary level.

The apparatus in accordance with the present invention belongs to the class of devices just mentioned and is therefore a detector. This device is constituted by at least one capacitor (two, three or four capacitors in actual practice) and each capacitor forms part of an oscillating circuit. The detector further comprises electronic means for effecting a comparison between the oscillation frequency of said circuit and a reference frequency. The essential feature of the device lies in an original design of the capacitor plates and in the means employed for connecting these latter to the electronic measuring devices.

In laboratory appliances for carrying out the method recalled in the foregoing, it is not necessary to take any special precautions either in regard to the constructional design of capacitors or in order to establish connections. This no longer holds true under very severe conditions of utilization of the device, especially in the case of underwater petroleum recovery installations in which the capacitor plates are immersed in sea water and sometimes at great depths. Special precautions must in that case be taken in order to endow the device with high strength, good leak-tightness, corrosion resistance and, generally speaking, a high degree of reliability. This is precisely the aim of the present invention.

In order to achieve this aim, the detector comprises two parallel sectional members rigidly fixed to a common metallic base plate, a plurality of small metallic plates encased within an insulating central upright member placed between the two sectional members, the complete assembly being intended to form a plurality of capacitors in which the sectional members aforesaid constitute a capacitor plate having a common ground and in which each small plate constitutes the other capacitor plate.

Preferably, the electronic measuring means are placed within a leak-tight chamber located beneath the base plate aforesaid and are connected to the different small plates by means of electric conductors which traverse said base through a leak-tight passage.

Preferably again, the central support is constituted by an insulating core provided with compartments for accommodating the small metallic plates, said core being covered by two insulating side cheeks which are welded thereto.

The small metallic plates can be coated with an insulating resin prior to sheathing in plastic. Both the core and the cheeks are advantageously of plastic such as polyvinyl chloride, for example.

Spcial precautions are taken in order to ensure that the assembly achieves a high standard of leak-tightness. To this end, the central upright member is welded to an insulating base plate applied against a seal, the assembly consisting of insulating base plate and seal being applied against the metallic base plate by means of clamping bolts.

In order to perform its detecting function, the apparatus advantageously comprises electronic means of the digital type. To this end, each measuring circuit comprises a counter for receiving pulses from an oscillating circuit associated with a measuring capacitor and means for determining whether the contents of said counter attain a reference value during a given time interval.

Preferably, the oscillators of the measuring circuit operate within the range of a few kc/s to a few tens of kc/s. In the application under consideration, experience has led to the conclusion that practical difficulties are reduced to a minimum within this range.

The distinctive features and advantages of the present invention will in any case become more readily apparent from the following description of exemplified embodiments which are given by way of explanation and not in any limiting sense, reference being made to the accompanying drawings, wherein.

Figure 1:
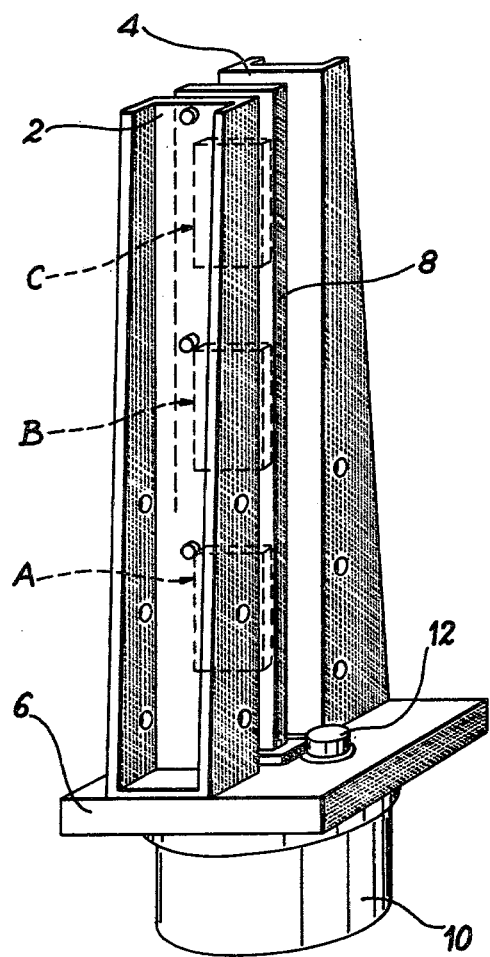
FIG. 1 is a general view of the detector in accordance with the invention.

In the embodiment which is illustrated in FIG. 1, the apparatus comprises two parallel channel-section members 2 and 4 which are mounted on a metallic base plate 6 and a central upright member 8 of insulating material which constitutes a capacitor plate holder; said capacitor plates are constituted by small metallic plates A, B, C encased within the central upright member. Beneath the base plate 6 is fixed a leak-tight chamber 10 containing the electronic measuring circuits; an underwater connector 12 is designed to receive a transmission cable for connecting the apparatus to the surface.

The sectional members 2 and 4 constitute a pair of grounded capacitor plates, the other capacitor plate being constituted by the plates A, B, C. Each capacitor is therefore double in the sense that it is constituted by two capacitors mounted in parallel and each having a common capacitor plate. It will of course be understood that three small plates are shown in the drawings only by way of example and that, in practice, provision can be made for any desired number.

Figure 2:
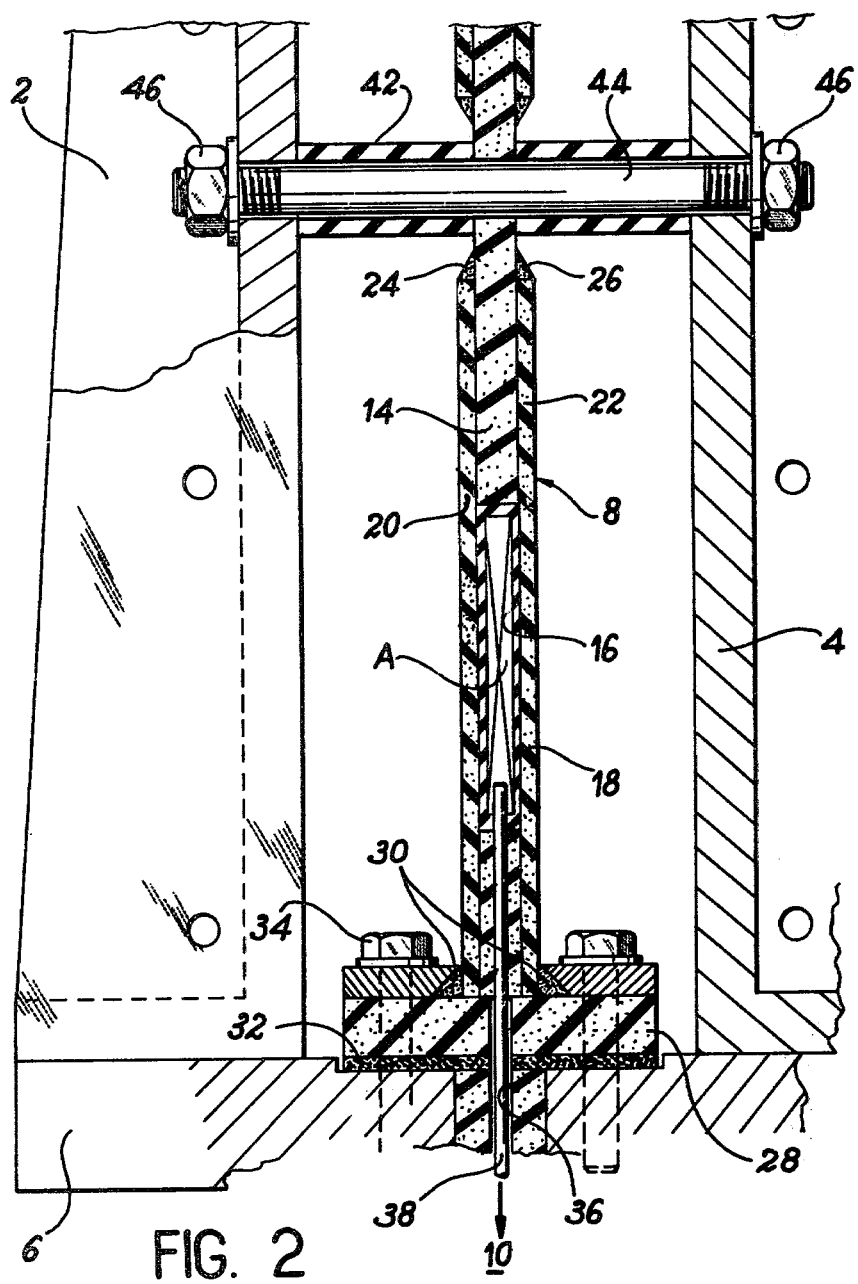
FIG. 2 is a sectional view of the capacitor plates.

FIG. 2 is a more detailed illustration showing the structure of the central capacitor plate as well as a particular mode of connection between said capacitor plate and the base plate.

The upright member 8 is advantageously constituted by a core 14 in which compartments 16 have been machined. The small metallic plates are introduced into said compartments (only the bottom small plate A is illusrated but the others are arranged in the same manner). This small plate is preferably provided with a coating 18 of insulating resin in order to improve the insulation. Two cheeks 20 and 22 are applied against the core 14 in order to maintain the small plates in position. Said cheeks are welded to the core by means of weld fillets 24 and 26. The central upright member is welded to an insulating base plate 28 by means of weld fillets 30. A seal 32 rests on the metallic base plate 6. Clamping bolts 34 apply the base plate 28 against the base plate 6. A leak-tight passage 36 is formed in the base plates in order to ensure that conductors 38 can connect each small plate of the central upright member to the measuring circuits contained in the leak-tight chamber 10, said chamber being attached to the underface of the base plate 6.

Insulating spacer tubes 42 are provided for the purpose of attaching the central upright member to the sectional members 2 and 4. Said spacer tubes are held in position by means of a tie-bolt 44 and nuts 46.

Preferably, the core 14, the cheeks 20 and 22, the base plate 28 and the spacer tube 42 are of plastic and especially of polyvinyl chloride. The fillet welds 24, 26 and 30 are accordingly obtained by blowing hot air onto the plastic with addition of plastic material.

Figure 3:
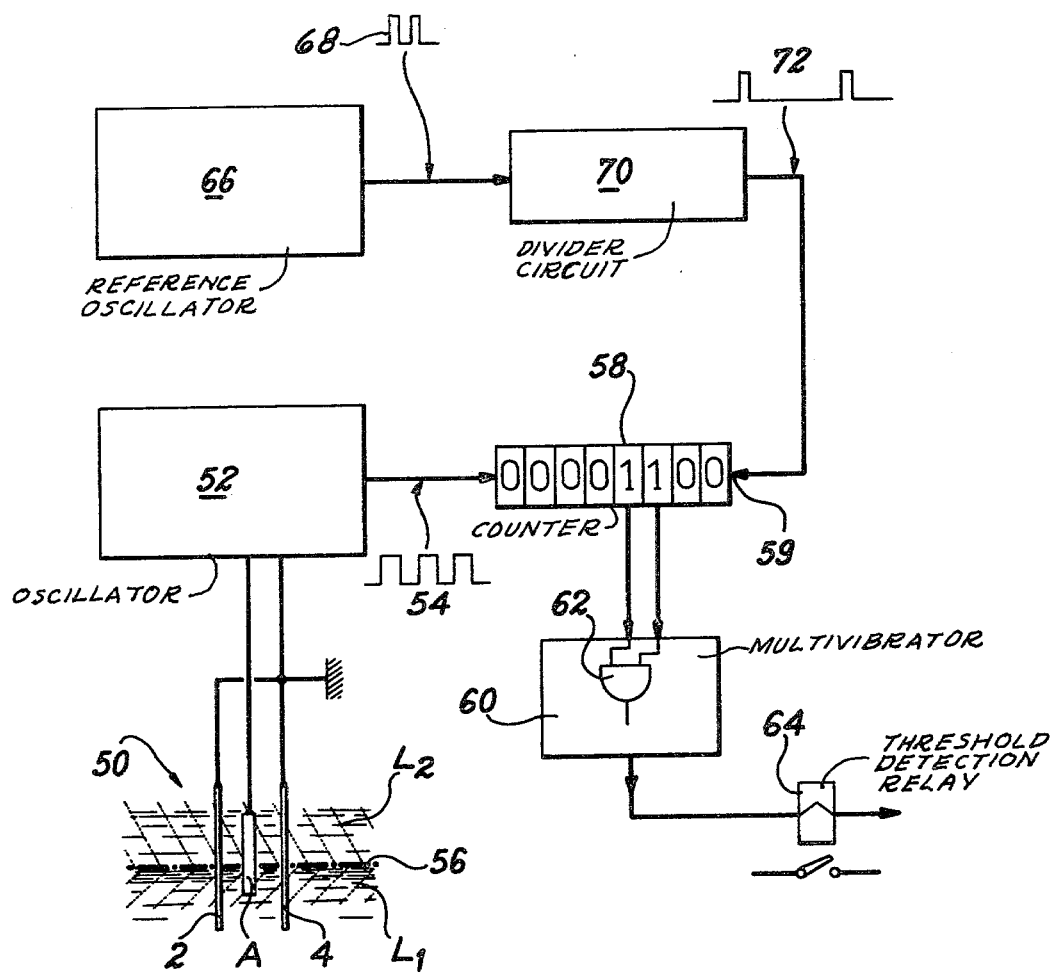
FIG. 3 is a block diagram of the electronic measuring means.

The essential means of the electronic measuring circuits are illustrated in FIG. 3. The measuring capacitor 50 formed by the plate elements 2 and 4 connected to ground (in practice to the metallic base plate) and by the central plate element A forms part of an oscillator 52. Ths circuit emits pulses 54, the repetition frequency of which is dependent on the value of capacitance of the capacitor 50 and therefore on the position of the interface 56 between the two liquids $L_1$ and $L_2$ in which the capacitor plates are immersed.

The pulses 54 are directed to a counter 58 which has a plurality of binary counting cells and a zero-reset input 59. A certain number of cells are connected to a retriggerable monostable multivibrator 60 provided at its input with a logical AND-gate 62. The multivibrator 60 controls a threshold detection relay 64. Moreover, a reference oscillator 66 emits a pulse train 68 at a reference frequency which is divided within a divider circuit 70 such as a scale-of-ten circuit, for example. The divider circuit 70 emits pulses 72 which are applied to the zero-reset input 59 of the counter 58.

In order to explain the operation of this circuit, it will be assumed by way of explanation that the frequency of the pulses emitted by the circuit 52 is 10 kc/s when the plates of the capacitor 50 are immersed in sea water and 25 kc/s when said capacitor plates are immersed in crude petroleum and when the reference level to be adopted for locating the water-petroleum boundary level is the mid-plane of the electrodes which corresponds to a frequency of approximately 13 kc/s. It will be noted that, since crude petroleum is lighter than sea water, the oscillation frequency is higher than 13 kc/s when the boundary level is located below the midplane. It will further be postulated that the reset pulses 72 are spaced at an interval of 1 ms.

Under these conditions, the zero-resetting of the counter 58 takes place at intervals of one millisecond before the contents of the counter have reached the number 13 if the frequency of the pulses 54 is below 13 kc/s, that is to say if the level of the boundary between the water and the crude petroleum is above the midplane of the electrodes. Conversely, zero-resetting takes place after said contents have reached the number 13 if the boundary level is located below said mid-plane. A comparison between the oscillation frequency and the reference frequency is accordingly equivalent to a comparison between the maximum contents reached by the counter 58 and a reference number.

In the particular case under consideration, it may be decided to detect overstepping of the number 12. Since this number is written 1100 in binary code, the inputs of the logical gate 62 will be connected to the counter cells of the order 3 and 4. When the number 12 has been reached, a pulse will be produced at the output of the logical gate 62 and will initiate a change of state of the multivibrator 60. The relay 64 will then indicate that the threshold has been overstepped.

It will naturally be possible to choose a threshold value other than the number 12, for example a number such as 13, but the gate 62 must in that case be connected to three counter cells respectively of the order 1, 3 and 4. p By way of explanation, the oscillating circuit 52 and the reference circuit 66 can be constituted by a single integrated circuit of the type SE556 mounted with a reference capacitor having a value of 100 pF, the divider can be an integrated circuit of the type 54L90, the counter can be a 5493 in which the terminals numbered 11 and 8 (corresponding to the number 1) are connected to two inputs of a multivibrator of the type 54L122; all these circuits are commercialized by the National Semiconductor Corporation.

Figure 4:
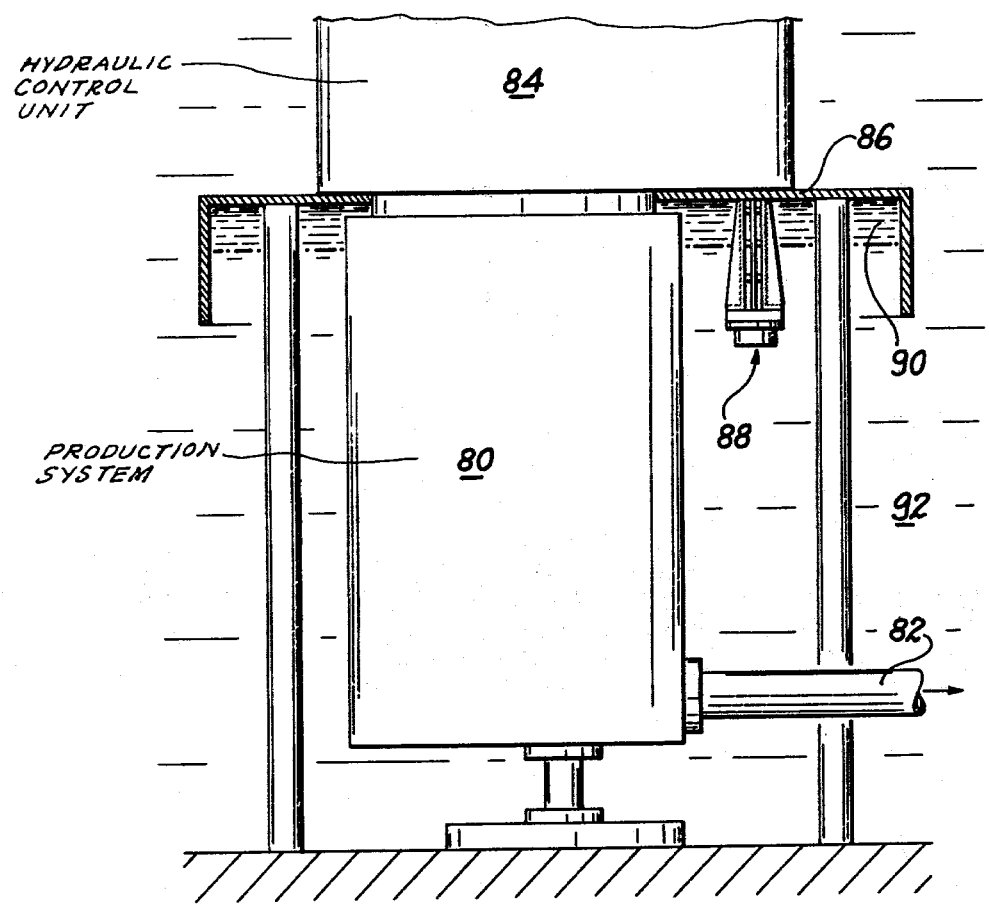
FIG. 4 illustrates the installation of an apparatus in accordance with the invention on an underwater wellhead for the production of petroleum.

FIG. 4 illustrates the position occupied by the apparatus which has just been described in the application to the detection of crude petroleum pollution in the vicinity of an underwater wellhead. This installation comprises a production system 80 fitted with distribution ducts, control valves and so forth which have not been shown in detail, a production pipe 82, a hydraulic control unit 84 which rests on a skirted base 86. The detector 88 in accordance with the invention is mounted beneath the base 86. In the event of leakage of crude petroleum at the level of an installation of this type, the crude petroleum accumulates at the top of the skirted housing (zone 90) and the apparatus 88 detects the position at the boundary level between the sea water 92 and the petroleum 90. The apparatus detects successively the transition of the water-crude boundary level by means of three reference levels corresponding to the mid-planes of the three capacitor plate elements A, B and C and thus makes it possible to follow the progression of the quantity of petroleum which has accumulated beneath the skirted housing.

What we claim is:

1. A detector for locating the interfacial boundary level between two liquids having different dielectric constants, of the type comprising a plurality of capacitors formed by two parallel external capacitor plates supported by a metallic base plate and central capacitor plate elements electrically insulated from said base plate, said capacitor plate elements being immersed in at least one of the liquids, each capacitor plate element being adapted to form part of an oscillating circuit connected to electronic means for effecting a comparison between the oscillation frequency of said circuit and a reference frequency, wherein the external capacitor plate elements are constituted by two parallel sectional members and the central capacitor plate elements are constituted by small metallic plates encased within a central insulating upright member placed between the two sectional members, said central upright member forming an insulating core provided with compartments for accommodating the small metallic plates, said core being covered by two insulating side cheeks with are welded thereto.

2. A detector accordng to claim 1, wherein the central upright member is welded to an insulating base plate applied against a seal, the assembly consisting of insulating base plate and seal being applied against the metallic plate by means of clamping bolts.

3. A detector according to claim 1, wherein the central upright member is attached to the sectional members by means of insulating spacer tubes.

4. A detector according to claim 2 wherein the core, the side cheeks, and the insulating base plate are of plastic.

5. A detector according to any one of claims 1 to 4, wherein the small metallic plates are coated with insulating resin.

6. A detector according to any one of claims 1 to 4, wherein the electronic means comprise in the case of each capacitor:
- a counter for receiving the pulses from the oscillating circuit which comprises said capacitor,
- a reference oscillator for emitting reset pulses which are directed to said counter and a retriggerable monostable multivibrator whose input is connected to the counter and whose output controls a relay.

7. A detector according to any one of the claims 1 to 4, wherein the oscillating circuits operate within the range of a few kc/s to a few tens of kc/s.

8. A detector according to any one of claims 1 to 4, wherein said detector is placed beneath the top portion of an underwater petroleum production installation, said detector being such as to permit detection of the level of petroleum pollution of sea water in this production zone.

9. A detector according to any one of claims 1 to 4, comprising means beneath said base plate including a leak-tight chamber and a leak-tight passage, said electronic means being located in said leak-tight chamber, and electric conductors connected to said small metallic plates extending through said leak-tight passage in said base plate.

10. A detector according to claim 4 wherein the core, the side cheeks, and the spacer tubes are of plastic.

* * * * *